United States Patent [19]
Jastrzebski et al.

[11] Patent Number: 4,824,698
[45] Date of Patent: Apr. 25, 1989

[54] HIGH TEMPERATURE ANNEALING TO IMPROVE SIMOX CHARACTERISTICS

[75] Inventors: Lubomir L. Jastrzebski, Plainsboro; Gary W. Looney, Bordentown; David L. Patterson, Belmar, all of N.J.

[73] Assignee: General Electric Company, Schenectady, N.Y.

[21] Appl. No.: 137,314

[22] Filed: Dec. 23, 1987

[51] Int. Cl.⁴ .................. C23C 16/24; C23C 16/40
[52] U.S. Cl. .................. 427/255; 427/255.3; 427/372.2; 427/374.1; 427/402; 437/225; 437/233; 437/238; 437/243
[58] Field of Search .................. 427/255, 255.2, 255.3, 427/255.1, 376.2, 372.2, 402, 374.1; 437/225, 233, 238, 243, 239, 234; 357/91

[56] References Cited
U.S. PATENT DOCUMENTS 4,386,968 7/1983 Hinkel et al. .................. 437/239
4,631,804 12/1986 Roy .................. 437/228

OTHER PUBLICATIONS

M. J. Kim et al., "Surface Restoration of Oxygen-Implanted Silicon," *Journal of Applied Physics*, 54(4), Apr. 1983, pp. 1991–1999.

*Primary Examiner*—Sadie Childs
*Attorney, Agent, or Firm*—William Squire; James C. Davis, Jr.; Paul R. Webb, II

[57] ABSTRACT

The present invention provides a method of treating a SIMOX wafer so that oxygen precipitates and heavy metal, carbon, and other contaminants are substantially reduced. The method includes forming a protective layer on the SIMOX surface, heating the wafer and protective layer so that the precipitates and contaminants dissolve and diffuse into the protective layer, and slowly cooling the wafer to permit continued diffusion during cooling.

8 Claims, 3 Drawing Sheets

HIGH TEMPERATURE ANNEALING TO IMPROVE SIMOX CHARACTERISTICS

The present invention relates to a method of improving the crystalline perfection of a SIMOX article by reducing the level of oxygen precipitates and heavy metal, carbon, and other contaminants.

BACKGROUND OF THE INVENTION

Among various Silicon on Insulation (SOI) approaches SIMOX (separation by oxygen implantation) seems to be the most promising as an alternative for silicon on sapphire (SOS) in CMOS structures. During the SIMOX process, oxygen at the dose of about $1.0-2.0 \times 10^{18}$ cm$^2$ is implanted into a silicon wafer with energy of about 150-200 keV, within a temperature range of about 450°-650° C. To remove the implantation damage and to form a buried oxide layer, the SIMOX wafers are subsequently annealed at a temperature in the range from 1150° to 1400° C. A typical SIMOX structure is shown in FIG. 1 wherein a wafer 10 includes an oxygen implanted layer 12 and a regrown SIMOX film 14. A thin surface layer ($\cong$ 10-20 nm) of the SIMOX wafers serves as a seed during the solid state regrowth process. The degree of crystalline perfection of this layer will influence the crystallographic perfection of the regrown SIMOX film 14.

It is well known that high density crystallographic defects of the SIMOX material and the presents of contaminants such as heavy metals and carbon adversely affect the ultimate performance of devices formed in the SIMOX material. Heavy metal and carbon contaminants which are commonly found in the SIMOX material originate from impurities which are sputtered from internal parts of the ion implantor itself. These contaminants appear in different form such as nuclei dispersed within the SIMOX material. Oxygen precipitates collect around these nuclei thereby forming crystallographic defects in the SIMOX material during high temperature annealing. It would be desirable to have a method of reducing the number of crystallographic defects by removing oxygen precipitates and by removing these contaminants from the SIMOX material prior to device fabrication.

SUMMARY OF THE INVENTION

The present invention is a method of treating an article of SIMOX material to reduce both crystallographic defects and heavy contamination. A protective layer is formed over the SIMOX article and the article and protective layer are then heated so that at least a portion of the heavy metal contaminants diffuse into the protective layer and the crystallographic defects are reduced.

DESCRIPTION OF THE PREFERRED EMBODIMENT

Figure 1:
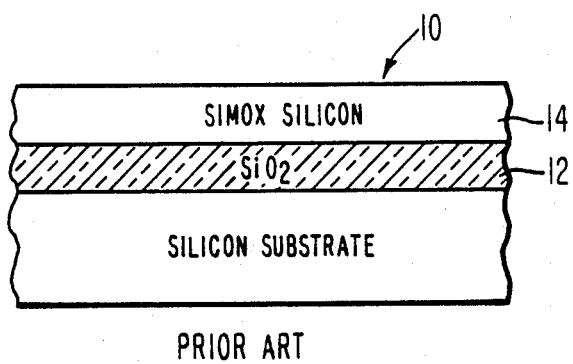
FIG. 1 is a partial cross-sectional view of a SIMOX wafer.
Figure 2:
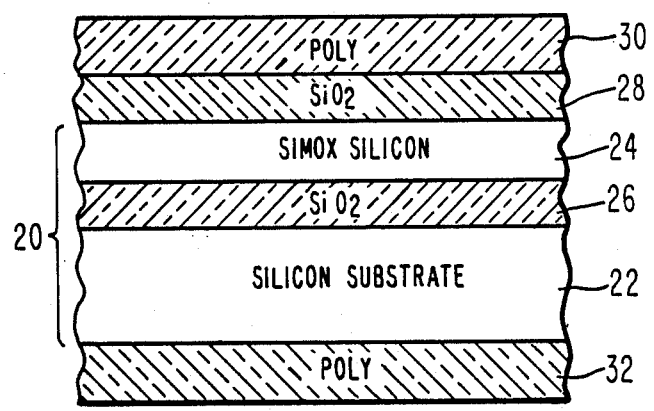
FIG. 2 is a partial cross-sectional view of a SIMOX wafer preparatory to annealing in accordance with the teachings of the present invention.

There is shown in FIG. 2 a SIMOX wafer 20 comprising a monocrystalline silicon substrate 22, a SIMOX film 24, and an oxygen impanted layer 26 of silicon dioxide. A layer 28 of silicon dioxide having a thickness of about 2000 angstroms is disposed on the surface of the SIMOX film. This layer 28 is a protective layer which will prevent oxidation of the SIMOX film 24 during subsequent heating of the wafer 20 and will act as a sink for contaminants. FIG. 2 also shows a pair of polycrystalline silicon layers 30 and 32 each having a thickness of about 5000 angstroms. The layer 30 is deposited on the layer 28 of CVD oxide and the layer 32 is deposited on the surface of the substrate 22 opposite the SIMOX film 24. These poly layers are formed in any suitable manner that is well known in the art. While the invention may be practiced without the layers 30 and 32, these layers of polycrystalline silicon enhance the migration of contaminants to the protective layer 28 as will be explained below.

In practicing the method of the present invention, a layer 28 of silicon dioxide, having a thickness of about 2000 angstroms, is deposited on the surface of the SIMOX film 24. The layer 28 of SiO$_2$ is deposited by chemical vapor deposition (CVD), a process that is well known in the industry.

Figure 3:
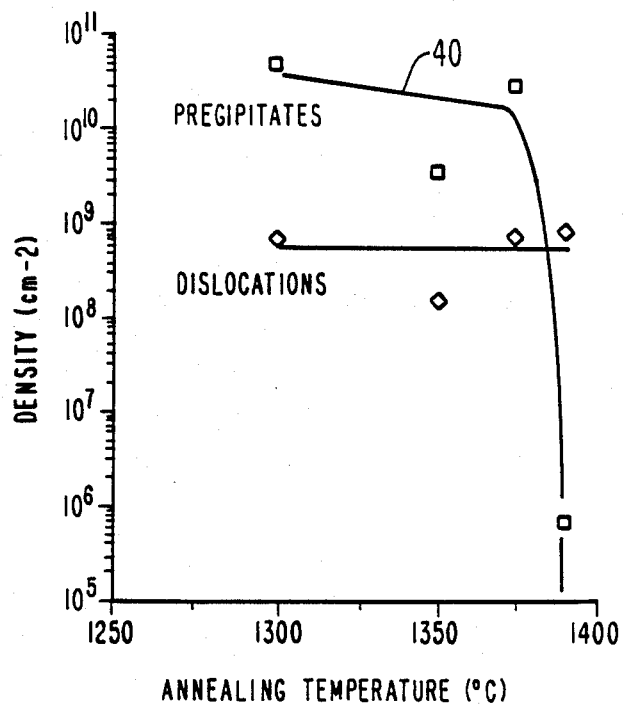
FIG. 3 is a graph showing annealing temperatures with respect to crystallographic defect density for SIMOX material.

The wafer 20 and layer 28 are then heated in an atmosphere of nitrogen having some residual oxygen, to a temperature which is sufficiently high to disolve foreign precipitates such as oxygen, carbon, heavy metals, and others which are present in the SIMOX film 24. In the present case, a temperature slightly above 1375° C. was used. FIG. 3 shows a graph 40 which represents the density of precipitates with respect to the annealing temperature. As is shown, for temperatures between about 1300° C. and 1350° C., the density of precipitates remains quite high. It is emphasized that this density of precipitates is strongly correlated to concentration of contamination. At a temperature of about 1375° C., however, there is a dramatic decrease in the density of precipitates. Care must be taken, however, to avoid exceeding the melting point of the SIMOX material which is about 1410° C. If the melting point is exceeded the SIMOX film will sag and loose its shape. The temperature need only be high enough to disolve the precipitates and contaminant nuclie present in the SIMOX layer. This temperature is maintained for a period of about 90 minutes so that all of the precipitates have an opportunity to disolve. The contaminants from disolved precipitates have a propensity to migrate from the SIMOX film into the adjacent layers of SiO$_2$. The mechanism by which this occurs is thought to be related to the higher solubility limit of heavy metals and other such contaminants in SiO$_2$ than in monocrystalline silicon at high temperature. In any case, at a temperature slightly above 1375° C. the disolved precipitates do migrate out of the SIMOX film 24 and into the SiO$_2$ layers 26 and 28 on either side of the SIMOX film. The wafer 20 and protective layers 28 are then slowly cooled at a rate that will maintain the tendency of the disolved precipitates to migrate toward the SiO$_2$ layers. If the wafer and protective layer are cooled too quickly, the degree of contaminant migration is substantialy reduced. A cooling rate of about 3° C. to about 5° C. per minute was found to be satisfactory.

This procedure leaves the SIMOX film 28 substantially free of foreign precipitates, which greatly enhances the operating characteristics of devices fabricated in this SIMOX film. Migration of some of the foreign precipitates into the layer 26 of implanted $SiO_2$, however, degrades somewhat the level of purity of this dielectric layer. This, of course, may adversely affect its usefulness in applications requiring high dielectric isolation.

One way to reduce the undesirable migration of precipitates into the implanted layer 26 of $SiO_2$ is to apply a slight stress to the surface of the substrate 22 opposite the layer 26. This can be accomplished by depositing a layer of polycrystalline silicon onto both sides of the SIMOX wafer. A layer 30 of polycrystalline silicon having a thickness of about 5000 angstroms is deposited on the surface of the protective layer 24 and a similar layer 32 of polycrystalline silicon is deposited on the bottom of the substrate 22 as shown in FIG. 2. The layers 30 and 32 cause a stress in the substrate 22 and SIMOX layer 24, however, the layer 30 causes a somewhat smaller stress due to the stress absorbing effect of the protective layer 28 of $SiO_2$. This results in a structure having a net stress in the SIMOX film 24 favoring migration of foreign contaminants in a direction toward the protective layer 28 rather than toward the layer 26 of implanted $SiO_2$. Additionally, the layer 30 provides additional protection against oxidation of the SIMOX film 24.

In addition to the reduction in the density of precipitates, the concentration of heavy metals in the SIMOX layer is substantially reduced after annealing as is shown in FIGS. 4 through 7. FIGS. 4 through 7 include graphs 42, 44, 46, and 48 which depict the concentration of contaminants of carbon, Ni, Fe, and Cu respectively for various annealing temperatures. The concentrations shown were obtained by secondary ion mass spectroscopy (SIMS) measurements in the usual manner.

Figure 8:
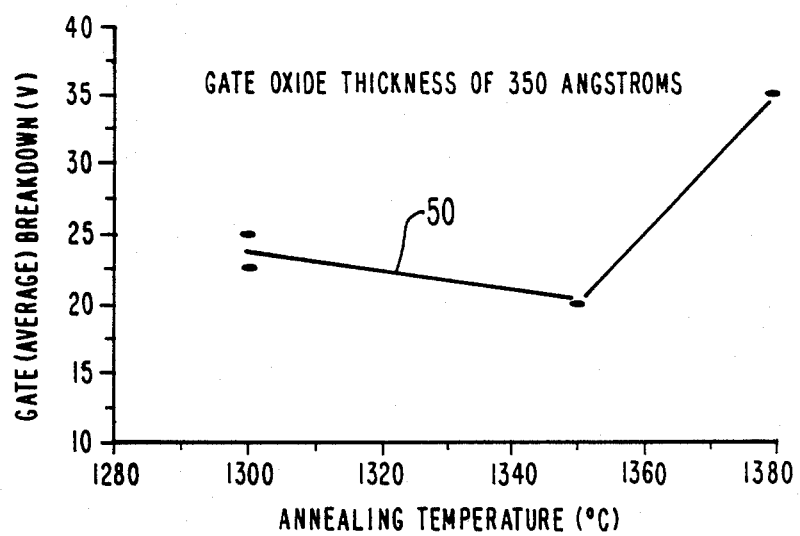
FIG. 8 is a graph showing average breakdown voltage for gate oxide at various temperatures.
Figure 4:
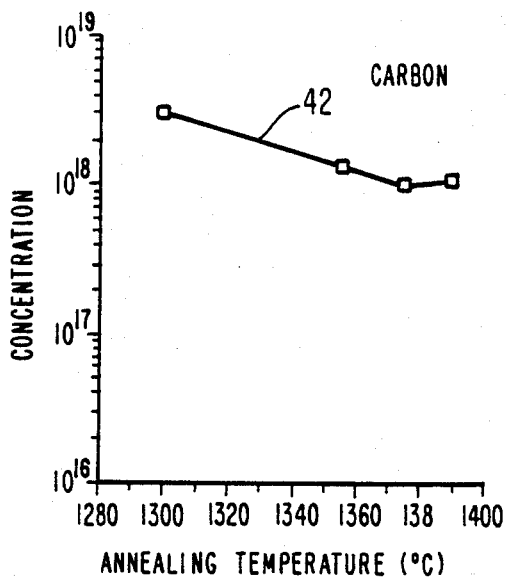
FIGS. 4 through 7 are graphs showing concentration of contaminants of carbon, Ni, Fe, and Cu respectively for various annealing temperatures.
Figure 5:
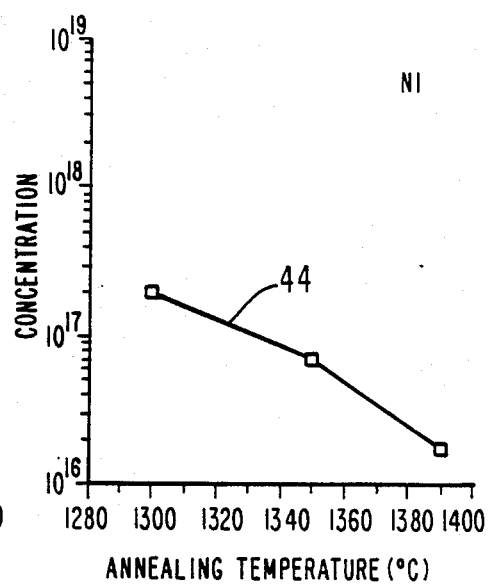
Figure 6:
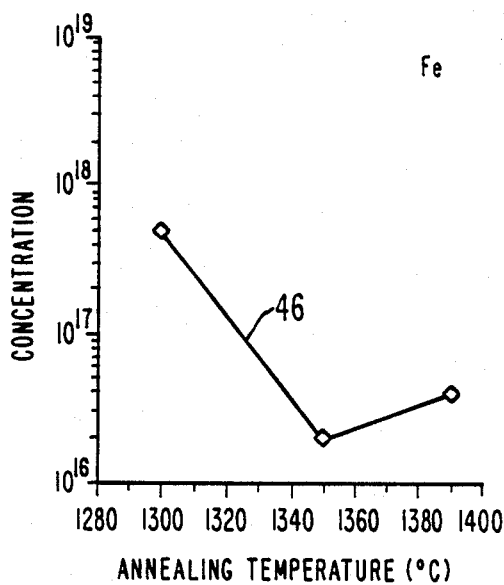
Figure 7:
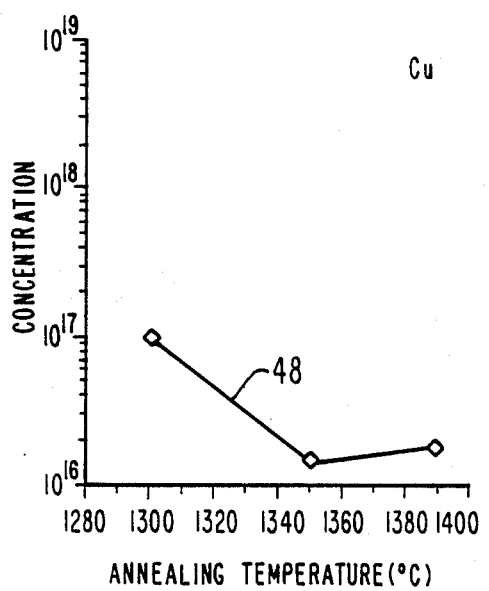

The important advantage of the present invention is that the defect density of SIMOX films may be significantly reduced, thereby permitting the fabrication of higher performance semiconductor devices in such films. An example of this is depicted in the graph 50, shown in FIG. 8, where improvement in gate oxide dielectric strength in the SIMOX layer is ploted against annealing temperature. For the temperature required to disolve oxygen precipitates, in the present example about 1375° C., the gate oxide integrity is dramatically improved.

What is claimed is:

1. A method of treating an article of separation by oxygen implantation (SIMOX) material to reduce the density of cyrstallographic defects by removing oxygen precipitates and contaminants therefrom, said article including a substrate, an implanted layer of silicon dioxide and a layer of a SIMOX silicon, the method comprising the steps of:
    (a) forming a protective silicon dioxide layer on said layer of SIMOX silicon to preclude oxidation of said SIMOX silicon during subsequent heating as set forth below in step (b);
    (b) heating said SIMOX article and said protective layer so that a significant portion of said precipitates and contaminants migrate toward and diffuse into said protective layer so that said cyrstallographic defects and contaminants are significantly reduced.

2. The method set forth in claim 1 including cooling said SIMOX article and said protective layer after said heating step at a sufficiently slow rate so that said contaminants disolved in said SIMOX material continue to diffuse into said protective layer during said cooling.

3. The method set forth in claim 1 wherein said heating occurs at a temperature sufficiently high to disolve said precipitates and said contaminants without melting said layer of SIMOX silicon.

4. The method set forth in claim 1 wherein said forming a protective layer comprises depositing said layer of silicon dioxide by chemical vapor deposition.

5. The method set forth in claim 1 wherein said heating occurs at a temperature of from about 1300° C. to about 1400° C.

6. The method set forth in claim 5 wherein said heating occurs at a temperature greater than about 1370° C.

7. The method set forth in claim 1 including, prior to said heating said SIMOX article, creating a stress on said article which causes said contaminants to tend to migrate toward said protective layer of $SiO_2$ to a higher degree than to said implanted layer of silicon dioxide.

8. The method set forth in claim 7 wherein said substrate has first and second major surfaces, said implanted layer of silicon dioxide being disposed on one of said first and second surfaces, said creating a stress on said article includes forming a layer of polycrystalline silicon on the other major surface of said substrate.

* * * * *